US011335825B2

(12) United States Patent
Van Sieleghem (10) Patent No.: US 11,335,825 B2
(45) Date of Patent: May 17, 2022

(54) SINGLE-PHOTON AVALANCHE DIODE AND A SENSOR ARRAY (71) Applicants: IMEC vzw, Leuven (BE); Katholieke Universiteit Leuven, Leuven (BE)

(72) Inventor: Edward Van Sieleghem, Leuven (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 17/030,203

(22) Filed: Sep. 23, 2020

(65) Prior Publication Data
US 2021/0119069 A1    Apr. 22, 2021

(30) Foreign Application Priority Data

Oct. 18, 2019 (EP) .................................. 19204088

(51) Int. Cl.
*H01L 31/0352* (2006.01)
*H01L 27/144* (2006.01)
(Continued)

(52) U.S. Cl.
CPC .... *H01L 31/03529* (2013.01); *H01L 27/1446* (2013.01); *H01L 31/107* (2013.01); *H01L 31/02161* (2013.01); *H01L 31/022408* (2013.01)

(58) Field of Classification Search
CPC ............. H01L 31/03529; H01L 31/107; H01L 31/02161; H01L 31/022408; H01L 27/1446
See application file for complete search history.

(56) References Cited

U.S. PATENT DOCUMENTS

| 2012/0299141 A1 | 11/2012 | Sasahata et al. |
| 2013/0328120 A1* | 12/2013 | Ueno .................... H01L 29/861 257/329 |
| 2021/0057463 A1* | 2/2021 | Iwata .................... G01J 1/4228 |

FOREIGN PATENT DOCUMENTS

| CN | 108039390 A | 5/2018 |
| CN | 109346552 A | 2/2019 |
| WO | WO-2018101033 A1 * | 6/2018 ....... H01L 27/14627 |

OTHER PUBLICATIONS

Extended European Search Report in European Patent Application No. 20200333.1 dated Jan. 29, 2021.
(Continued)

*Primary Examiner* — Sitaramarao S Yechuri
(74) *Attorney, Agent, or Firm* — Knobbe, Martens, Olson & Bear, LLP (57) ABSTRACT

A single-photon avalanche diode (SPAD) is disclosed. In one aspect, the SPAD comprises an inner doped region, a geometrical structure of a boundary of the inner doped region rotationally symmetric in a horizontal direction of a substrate; at least one outer doped region connected to a second terminal, the at least one outer doped region arranged to at least partially enclose the inner doped region and the outer doped region comprising dopant implantations of a different type than the inner doped region; a lowly doped depletion volume arranged to surround the inner doped region, a depth of the lowly doped depletion volume extending from the top surface of the substrate into the substrate being larger than a depth of the at least one outer doped region, and when a reverse bias is applied to an anode, an electric field peak around the inner doped region being formed to enable impact ionization and multiplication of charges.

20 Claims, 3 Drawing Sheets

(51) Int. Cl.
  *H01L 31/107*  (2006.01)
  *H01L 31/0216* (2014.01)
  *H01L 31/0224* (2006.01)

(56) References Cited

OTHER PUBLICATIONS

Ciftcioglu et al., Integrated Silicon PIN Photodiodes Using Deep N-Well in a Standard 0.18-μm CMOS Technology, Journal of Lightwave Technology, IEEE, vol. 27, No. 15, Aug. 1, 2009, pp. 3303-3313.

Grubisic et al., New Silicon Reach-Through Avalanche Photodiodes with Enhanced Sensitivity in DUV/UV Wavelength Range, 36th International Convention on Information and Communication Technology, Electronics and Microelectronics (MIPRO), IEEE, May 2013, pp. 48-54.

Takai et al., Single-photon Avalanche Diode with Enhanced NIR-Sensitivity for Automotive LIDAR Systems, Sensors, vol. 16(4), 2016, in 9 pages.

McManamon et al., Comparison of Flash Lidar Detector Options, Optical Engineering, vol. 56(3), Mar. 2017, pp. 031223-1 to 031223-23.

Rochas et al., Single Photon Detector Fabricated in a Complementary Metal-Oxide-Semiconductor High Voltage Technology, Review of Scientific Instruments, vol. 74. No. 7, Jul. 2003, pp. 3263-3270.

Xiao et al., A New Single Photon Avalanche Diode in CMOS High-Voltage Technology, The 14th International Conference on Solid-State Sensors, Actuators and Microsystems, Jun. 2007, IEEE, pp. 1365-1368.

You et al., 3μm Pitch, 1μm Active Diameter SPAD Arrays in 130nm CMOS Imaging Technology, International Image Sensor Workshop 2017, Hiroshima, Japan, Feb. 2017, pp. 238-241.

\* cited by examiner (Prior art) Fig. 1

SINGLE-PHOTON AVALANCHE DIODE AND A SENSOR ARRAY

CROSS-REFERENCE TO RELATED APPLICATIONS

This application claims foreign priority to EP 19204088.9 filed Oct. 18, 2019 and titled "A SINGLE-PHOTON AVALANCHE DIODE AND A SENSOR ARRAY", the content of which is incorporated by reference herein in its entirety.

BACKGROUND OF THE INVENTION

Technological Field

The disclosed technology generally relates to the field of light detection. More in particular, the disclosed technology relates to light detection using single-photon avalanche diodes, which may be arranged in an array.

Description of the Related Technology

A commonly-used technique for single-photon detection is based on solid-state avalanche photodiodes. Such devices may be operated in the so-called Geiger mode, meaning that individual photo-generated charges are multiplied into detectable charge packets through impact ionization in a large electric field. When operating in this mode, the detector may be referred to as a single-photon avalanche diode (SPAD). For many applications, including for example range-finding, detecting near-infrared (NIR) radiation with high efficiency using such SPAD detectors may be important.

To exploit well-established semiconductor processing platforms, and to simplify on-chip integration of CMOS circuitry, there may be a strong interest in developing and fabricating arrays of such SPADs in silicon. However, due to the low energy (for example, ~1 eV) of NIR radiation, silicon provides a small absorption coefficient for such radiation. Therefore, a large depleted volume may be required in addition to a large electric field. This may introduce trade-offs between detection speed, noise, uniformity, and sensitivity. Implementing arrays of SPADs in silicon may thus be challenging.

SUMMARY OF CERTAIN INVENTIVE ASPECTS

An objective of the disclosed technology is to provide a single-photon avalanche diode (SPAD) that enables detection of photons with a relatively high uniformity and sensitivity.

These and other objects of the disclosed technology are at least partly met by the disclosed technology as defined in the independent claims. Preferred embodiments are set out in the dependent claims.

According to a first aspect of the disclosed technology, there is provided a single-photon avalanche diode (SPAD) for use in a complementary metal-oxide-semiconductor (CMOS) integrated circuit and adapted for detection of light, such as visible or near infrared light, the SPAD comprising: a semiconductor substrate comprising a top surface at a front side and a back side opposite to the front side; an inner doped region disposed at a top surface of a semiconductor substrate connected to a first terminal, wherein a geometrical structure of a boundary of the inner doped region is rotationally symmetric in a horizontal direction of the semiconductor substrate and wherein the inner doped region comprises dopant implantations of a first type; at least one outer doped region disposed at a top surface of a semiconductor substrate connected to a second terminal, wherein the at least one outer doped region is arranged to at least partially enclose the inner doped region in the horizontal direction of the semiconductor substrate and wherein the outer doped region comprises dopant implantations of a second type; a lowly doped depletion volume, which is arranged to surround the rotationally symmetric inner doped region and which comprises dopant implantations of the first type or dopant implantations of the second type; wherein a depth of the lowly doped depletion volume extending from the top surface of the semiconductor substrate into the semiconductor substrate is larger than a depth of the at least one outer doped region, wherein the second terminal and the back side of the semiconductor substrate are commonly connected, and wherein one of the first and the second terminal forms an anode and another of the first and the second terminal forms a cathode; and wherein the SPAD is configured such that, when a reverse bias is applied to the anode, an electric field peak around the inner doped region is formed to enable impact ionization and multiplication of charges.

The SPAD according to the first aspect may provide a localized electric field peak which is controlled by the geometry of implants. This implies that there is control over generation of the localized electric field peak, which makes the SPAD relatively insensitive to process variations.

Further, the SPAD may provide a high photon detection efficiency and may be particularly useful for detection of near infrared light, although the SPAD may also or alternatively be used for detection of other wavelengths.

The electric field in the depletion volume can be represented by field lines. When a reverse bias is applied, field lines start at an edge of a space charge region near the doped region that is electrically connected to the terminal with the higher potential and end at the edge of the space charge region near the doped region that is electrically connected to the terminal with the lower potential. Because the inner doped region is at least partially enclosed by the outer doped region, the surface of the edge of the space charge region around the inner doped region is smaller than the surface of the edge of the space charge region near outer doped regions and the bottom surface of the lowly doped depletion volume. Consequently, the field line density must be larger near the inner doped region. This results in a local field peak near the inner doped region. Therefore, the geometry of the SPAD may provide a localized electric field peak, which may be approximately uniform, close to the inner doped region which may facilitate light detection.

The dopant implantations of the first type are different than the dopant implantations of the second type.

According to an embodiment, the at least one outer doped region is arranged to at least partially enclose the inner doped region such that, when the reverse bias is applied to the anode, a surface of a space charge region at the at least one outer doped region is larger than a surface of a space charge region at the inner doped region.

According to an embodiment, a ratio of a depth of the lowly doped depletion volume to a horizontal spacing at the top surface between the inner doped region and the outer doped region is between 1-4.

According to an embodiment, a horizontal spacing at the top surface between the inner doped region and the outer doped region is between 2-10 µm.

According to an embodiment, a depth of the lowly doped depletion volume is between 5-30 µm.

According to an embodiment, the boundary of the inner doped region is a surface of a volume in which a dopant concentration is above $1\times10^{16}$ cm$^{-3}$ and wherein the boundary forms a half sphere.

According to an embodiment, doping gradients at the boundary between the inner doped region and the lowly doped depletion volume is below $1\times10^{19}$ cm$^{-3}$ μm$^{-1}$.

The low doping gradient may be provided exactly at the boundary between the inner doped region and the lowly doped depletion volume, but the low doping gradient may also be provided in proximity of the boundary, such as extending +/−0.1 μm from the boundary.

According to an embodiment, a ratio between a depth and a radius of the rotationally symmetric geometric structure is between 0.7-1.3.

According to an embodiment, a depth of the rotationally symmetric geometric structure is between 0.3-1.5 μm and a radius of the rotationally symmetric geometric structure is between 0.3-1.5 μm.

According to an embodiment, the lowly doped depletion volume is configured to extend to a highly doped region at the back side.

According to an embodiment, the SPAD is configured for back side illumination, wherein the highly doped region is disposed at a surface of the back side, wherein a thickness of the highly doped region is below 1 μm and a dopant concentration is above $1\times10^{18}$ cm$^{-3}$.

According to an embodiment, the SPAD is configured for front side illumination, the highly doped region has a dopant concentration above $1\times10^{18}$ cm$^{-3}$ and has a thickness below 1 mm.

According to an embodiment, a doping concentration of the lowly doped depletion volume is below $1\times10^{14}$ cm$^{-3}$.

According to an embodiment, a doping concentration in the lowly doped depletion volume is graded towards a higher doping concentration farther away from the top surface.

According to an embodiment, the lowly doped depletion volume comprises dopant implantations of p-type.

According to an embodiment, the lowly doped depletion volume is depleted to at least 60% of its volume.

According to an embodiment, the inner doped region comprises an innermost region surrounded by an outermost region, wherein the innermost region has a higher doping concentration than the outermost region.

According to an embodiment, the outermost region defines the boundary of the inner doped region.

According to an embodiment, the innermost region is configured to form an ohmic contact with the first terminal.

According to an embodiment, the inner doped region comprises iso-concentration surfaces that define a doping profile of the inner doped region.

According to an embodiment, the iso-concentration surfaces of the outermost region of the inner doped region form approximate half spheres for concentrations ranging from $1\times10^{18}$ cm$^{-3}$ to $1\times10^{16}$ cm$^{-3}$.

According to an embodiment, the iso-concentration surface with concentration $1\times10^{17}$ cm$^{-3}$ has a radius between 0.5-1.0 μm.

According to an embodiment, the inner doped region comprises dopant implantations of n-type, wherein the outer doped region comprises dopant implantations of p-type.

According to an embodiment, each of the at least one outer doped region comprises a highly doped region and a moderately doped region, the highly doped region having a higher doping concentration than the moderately doped region.

According to an embodiment, the highly doped region is configured to form an ohmic contact with the second terminal.

According to an embodiment, the moderately doped region is arranged closer to the inner doped region than the highly doped region and wherein the moderately doped region defines the depth of the at least one outer doped region.

According to an embodiment, the outer doped region comprises iso-concentration surfaces that define a doping profile of the outer doped region.

According to an embodiment, a distance between the top surface and the back side is larger than a smallest distance between a center of the inner doped region and a iso-concentration surface with concentration $1\times10^{17}$ cm$^{-3}$ in the outer doped region by a factor between 1 and 4.

According to an embodiment, the depth of the outer doped region is between 0.5-3.5 μm.

According to an embodiment, the outer doped region comprises a portion bulging inwards from the top surface.

According to an embodiment, the SPAD further comprises a shallow lowly doped region at the top surface between the inner doped region and the outer doped region and above the lowly doped depletion volume.

According to an embodiment, the shallow lowly doped region comprises dopant implantations of the first type and has a doping concentration between $1\times10^{12}$ cm$^{-3}$ to $1\times10^{15}$ cm$^{-3}$.

According to an embodiment, the shallow lowly doped region has a thickness that is smaller than 200 nm.

According to an embodiment, the SPAD is configured such that, when the reverse bias is applied to the second terminal and the back side of the semiconductor substrate, the electric field peak does not extend to the top surface. The shallow lowly doped region may be depleted by more than 90% of its volume.

According to an embodiment, the SPAD is configured such that, when a reverse bias of 50V is applied to the anode, the electric field peak enabling impact ionization and multiplication of charges is formed.

According to an embodiment, the SPAD further comprises a top layer of silicon dioxide arranged above the top surface of the semiconductor substrate, wherein connections between the inner doped region and the first terminal and between the at least one outer doped region and the second terminal extend through the top layer.

According to an embodiment, the at least one outer doped region is configured to completely enclose the inner doped region in the horizontal direction of the semiconductor substrate.

According to an embodiment, the at least one outer doped region is configured to circularly enclose the inner doped region.

According to an embodiment, the at least one outer region comprises a plurality of outer regions, wherein the plurality of outer regions together enclose the inner doped region forming an n-fold symmetry around the inner doped region, where n>3.

According to a second aspect, there is provided a sensor array, comprising: an array of single-photon avalanche diodes, SPADs, wherein each SPAD in the array of SPADs is a SPAD according to any one of the preceding embodiments, and wherein the second terminals of each of the SPADs are commonly connected.

Effects and features of this second aspect are largely analogous to those described above in connection with the first aspect. Embodiments mentioned in relation to the first aspect are largely compatible with the second aspect.

According to an embodiment, the first terminals of each of the SPADs are separately connected for separate read-out of light detected by each of the SPADs.

According to an embodiment, the outer regions of each of the SPADs are shared and form a single coherent region.

According to an embodiment, a deep trench isolation structure is provided between each pair of adjacent SPADs in the array of SPADs.

According to an embodiment, lowly doped depletion volumes of adjacent SPADs transition into each other and a lowly doped depletion volume belonging to an individual SPAD is defined by a pitch of the array of SPADs.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

There is a strong interest in the development of SPAD arrays in, from, or on silicon. This allows for the exploitation of well-established semiconductor processing platforms and simplifies the on-chip integration of CMOS circuitry. Furthermore, silicon detectors generally exhibit better noise characteristics than germanium and III-V counterparts. However, a large disadvantage of silicon is the low NIR absorption coefficient, and therefore a low photon detection probability (PDP).

Figure 1:
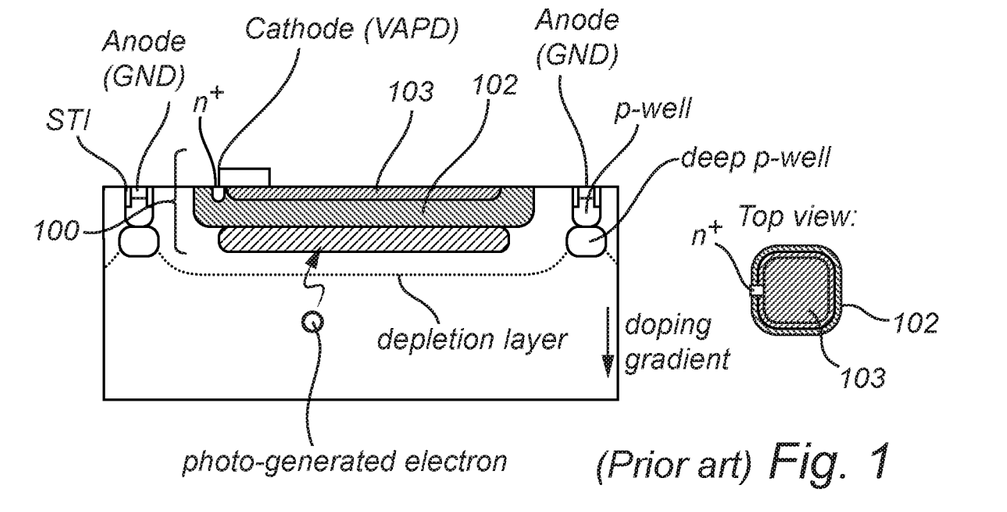
FIG. 1 shows a cross-section of the doping profile of a prior art planar NIR-enhanced SPAD as disclosed in Takai, Isamu, et al. "Single-photon avalanche diode with enhanced NIR-sensitivity for automotive LIDAR systems." Sensors 16.4 (2016): 459.

Reference is now made to FIG. 1, which is based on FIG. 1 of Takai, Isamu, et al. "Single-photon avalanche diode with enhanced NIR-sensitivity for automotive LIDAR systems.", Sensors 16.4 (2016): 459. Typically, NIR-enhanced SPADs 100 rely on deep pn-junctions formed by stacked p-type 103 and n-type 102 implants. They can be fabricated in a CMOS compatible platform with limited custom processing steps. A guard ring surrounding the junctions can be relatively simple and small, and the SPADs can be integrated into dense arrays. An example of a doping profile of such a device is given in FIG. 1. The junction contains a laterally uniform high-field region parallel to the top device interface. This approach, however, has two shortcomings:

- The absorption depth remains limited to a couple of microns. As a result, the single photon detection efficiency is typically not larger than 10% at 905 nm.
- Carriers absorbed on the sides of the junction have a lower detection probability, as they may not be transported through the high-field region or recombine too soon. This limits the photon detection efficiency of SPADs integrated into arrays. The size of the peripheral region is determined by the size of the guard ring, device contacts and any additional in-pixel circuits.

Figure 2:
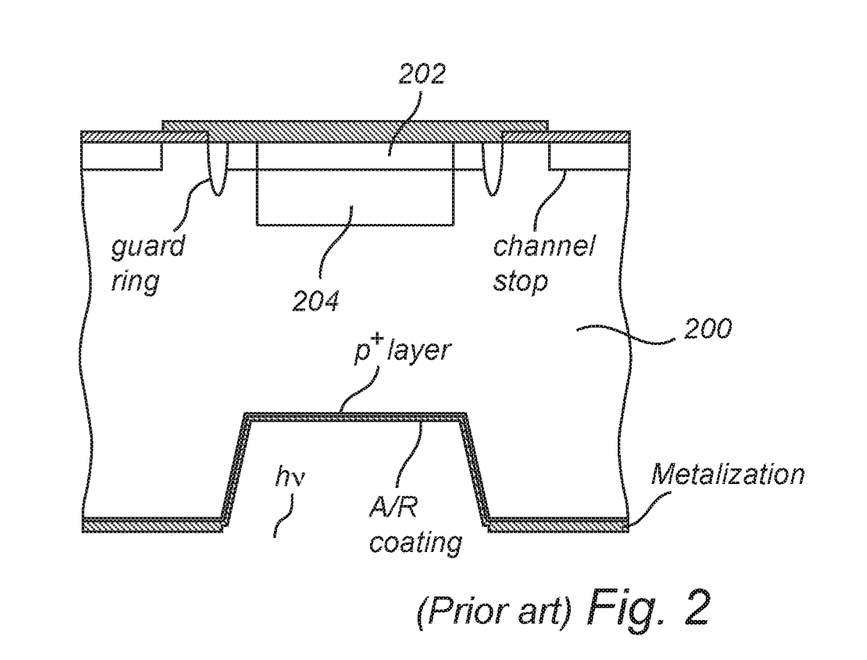
FIG. 2 shows a cross-section of the doping profile of a reach through prior art NIR-enhanced SPAD as disclosed in Grubišić, D., and A. Shah. "New silicon reach-through avalanche photodiodes with enhanced sensitivity in the DUV/UV wavelength range." 2013 36th International Convention on Information and Communication Technology, Electronics and Microelectronics (MIPRO). IEEE, 2013.

Reference is now made to FIG. 2, which is based on the Figure on page 1 of Grubišić, D., and A. Shah. "New silicon reach-through avalanche photodiodes with enhanced sensitivity in the DUV/UV wavelength range." 2013 36th International Convention on Information and Communication Technology, Electronics and Microelectronics (MIPRO). IEEE, 2013. The absorption depth may be increased to tens of microns by introducing a deep absorption region 200 below the top pn-junction as demonstrated in FIG. 2. The device is now called a reach through SPAD. The absorption region is lowly doped and fully depleted such that generated carriers are transported quickly towards the multiplication field. The main junction is still formed by dedicated p-type implants 204 and n-type implants 202 parallel to the top interface. The high field region remains contained within this junction. The addition of the thick depleted region results in additional shortcomings:

- The breakdown voltage is high (>>100 V) because the electric field distributes over the entire depleted volume from the moment the top pn-junction becomes depleted. Besides, the depletion behavior relies strongly on the doping profile of the top junction. This results in large sensitivity to process fluctuations. More specifically, small variations in the doping profile can result in large variations in the device behavior and breakdown voltage.
- If the absorption region is too deep, the transport time variance of carriers generated throughout the device may be poor (>>200 ps).
- Reach through SPADs are generally less suitable for monolithic integration into dense arrays. They tend to have a large diameter, require large peripheral structures, suffer from uniformity issues and/or sometimes use non-standard processing steps.
- The detection efficiency loss due to the lack of multiplication of charges from the periphery remains.

Typically, planar silicon NIR-enhanced SPAD designs rely on the doping profile of some sort of pn- or pin-junction for the formation of the multiplication field. Active measures are taken to prevent premature breakdown at the junction edges.

Figure 3:
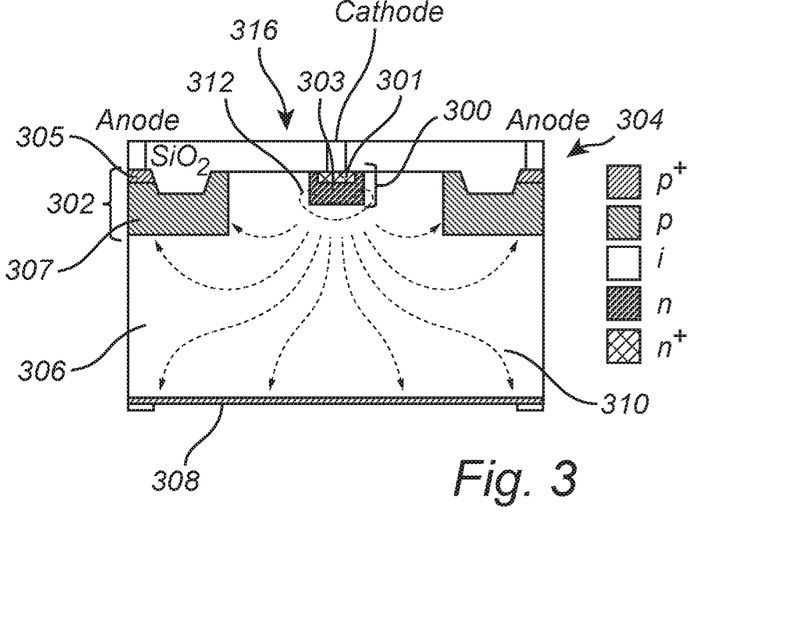
FIG. 3 shows a cross-section of the doping profile of one embodiment of a NIR-enhanced SPAD with a geometry-constrained field peak around a rotationally symmetric inner doped region. Field lines and the multiplication region are indicated.

FIG. 3 demonstrates the doping profile and electric field of a planar silicon SPAD based on separate absorption and multiplication (SAM). The doping profile consists of multiple inner n-type doping implantations 300 and outer p-type doping implantations 302 for the formation of the cathode and anode respectively. The anode encloses the cathode in the horizontal cross-section near the top oxide interface 304. The cathode and anode are separated by a lowly doped p-type 306 (nearly) fully depleted volume which extends up to tens of microns deep. The lowly doped volume terminates at the back of the SPAD 308. The anode is reverse biased above the breakdown voltage, and the backside 308 is biased at the same voltage as the anode. A dedicated doping implant for creating the multiplication field is absent. Consequently, the SPAD relies on the geometry of the implants for the formation of a localized uniform field peak 312 near the cathode, rather than on the doping profile of a steep pn-junction. More specifically, the geometry enforces the crowding of the electric field lines 310, 312 near the cathode, as demonstrated in FIG. 3. The field peak 312 is spherically uniform around the cathode but remains spaced away from the oxide interface. For optimal NIR detection efficiency, the SPAD is illuminated from the backside 308, so called backside illumination (BSI) 308. However, the SPAD may alternatively be illuminated from a frontside 316, so called frontside illumination (FSI). The SPAD is intended for the integration into large uniform monolithic arrays wherein all anodes are commonly connected, and each cathode is connected to a separate readout circuit. Doping types may be interchanged. If so, the cathodes are commonly connected while the anodes are separately read out.

A single SPAD in an array can be described generically as follows:
An electrically connected inner doped region 300 comprising of one or more shallow narrow rotationally symmetric dopant implantations of a first type.
One or more electrically connected outer doped regions 302 comprising of one or more dopant implantations of a second type, partially or fully enclosing the inner doped region in a horizontal cross-section.
A lowly doped region 306 of either the first type or second type separating and surrounding the inner doped region 300 and outer doped region 302 and extending to the backside 308 of the SPAD.
At the operating voltage:
An approximately spherically uniform electric field peak 312 surrounding the inner doped region 300, sufficiently high to enable impact ionization and Geiger mode multiplication.
An electric field 310 in the lowly doped region 306, such that the lowly doped region 306 is (nearly) fully depleted and the therein generated carriers move quickly to the SPAD electrodes.

The SPAD detector may have the following properties and features (in no particular order):
The detector is made of silicon and has a breakdown voltage near or below 50 V. This allows for relatively easy monolithic integration, system integration and CMOS compatibility (using a custom process).
The narrow inner doped region 300 is surrounded by an approximately uniform field peak 312. The field peak 312 does not extend to the oxide interface. Charges moving in any direction through the field peak 312 have large probabilities of being multiplied through impact ionization. Charges generated in the lowly doped volume 306 below the outer doped regions 302 are also multiplied efficiently (these charges would typically not be multiplied in 'standard' SPADs). The field peak 312 is formed by the local crowding of the electric field lines 310. In reference to a 'standard' SPAD with a steep pn-junction, this behavior can be thought of as 'controlled' premature edge breakdown.
The NIR photon detection efficiency is high (>15% at 905 nm) because the lowly doped volume 306 is a least 10 μm deep. The temporal response (in particular, transport time variance) remains acceptable (<200 ps) because the lowly doped region 306 is (nearly) fully depleted such that a sloped electric field directed away from the cathode is present.
The sensitivity to process variations is low, resulting in high device uniformity. The main cause of non-uniformity for the device illustrated in FIG. 2 is the vertical doping profile (implantation dose and energy) of the steep pn-junction near the top interface. In the absence of the deeper doped region, this source of variability is removed. However, this doped region is responsible for creating the junction in which a laterally uniform field peak can develop. In the absence of this region, the device illustrated in FIG. 2 would either have an unreasonably high breakdown voltage (>>1000 V) or prematurely breakdown at the junction edges resulting in poor NIR sensitivity. In the presently disclosed device, the wide pn-junction is replaced by a narrow central doped region 300 from which the depletion region extend gradually into the lowly doped region 306 as the reverse bias is increased. Due to the geometry, the field line density is higher near the narrow central implant 300 resulting in a local field peak 312.

Features of an embodiment of the SPAD detector can be summarized as follows:
The detector employs a geometry-constrained uniform field peak 312 around a narrow central doped region 300. The field extends into a deep lowly doped region 306. Compared to other silicon NIR-enhanced SPAD architectures, this allows for higher NIR photon detection efficiency, near-unity BSI fill factor, acceptable breakdown voltage and lower sensitivity to process variations. The time resolution also remains acceptable for time-of-flight applications.

The shapes, doping profiles and relative sizes of the different design elements may facilitate these features. For instance, the inner doped region 300 may be small and rotationally symmetric to allow for an approximately spherically uniform field peak 312. On the other hand, the outer doped region 306 need not necessarily comply with specific symmetries, as long as the shape does not affect the uniformity of the field peak 312 and allows for efficient depletion and a low breakdown voltage.

Figure 4:
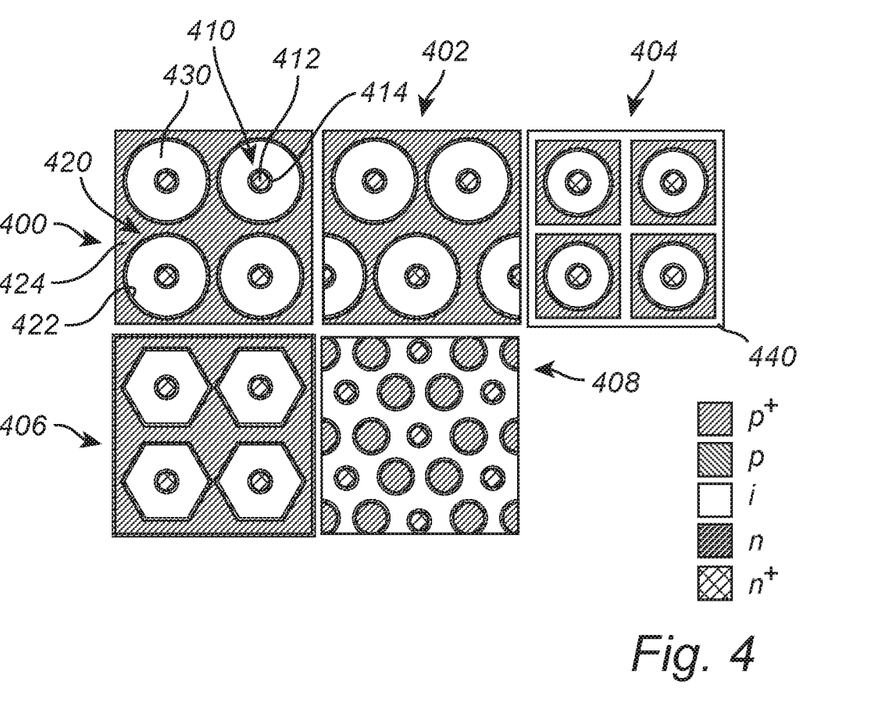
FIG. 4 shows a non-exhaustive set of horizontal cross-sections of possible arrangement of different device regions in a NIR-enhanced SPAD array with geometry-constrained field peaks.

FIG. 4 demonstrates a non-exhaustive set of horizontal cross sections near the top interface of possible arrangements 400, 402, 404, 406, 408 of the doped regions in an array of SPADs. The arrangement 400 may be preferred. Deep trench isolation (DTI) 440 may be employed to reduce optical crosstalk.

The following list enumerates non-exhaustive guidelines and constraints on the different elements of the disclosed device (in no particular order) such that the beforementioned features may be obtained:
The inner doped region 300, 410 consists of a moderately doped region 303, 414 with a concentration between $1 \times 10^{16}$ cm$^{-3}$ and $1 \times 10^{18}$ cm$^{-3}$, and a highly doped region 301, 412 at the interface with a concentration above $1 \times 10^{18}$ cm$^{-3}$. The highly doped region 301, 412 is fully enclosed by the moderately doped region 303, 414. Its purpose is the formation of an ohmic contact with a metal electrode. The inner doped region 300, 410 is non-depleted to a high degree at the operating conditions. The doping concentration has a limited contribution to the shape of the field peak.
The surrounding surface of the inner doped region 300, 410 at the doping transition to the lowly doped region 306, 430 is rotationally symmetric and has a depth and radius between 0.3 μm and 1.5 μm, for example approximately 0.7 μm. The surface contains no sharp corners or excessively steep doping gradients, for example steeper than $1 \times 10^{19}$ cm$^{-3}$ µm$^{-1}$. The small size of the region enforces local crowding of the electric field lines. This results in a local field peak in which impact ionization and Geiger mode multiplication can occur. The size is sufficiently small to allow for a breakdown voltage near or below 50 V. The shape should encourage the formation of a spherically uniform field peak, for example, by having a radius-to-depth ratio around 1.

The outer doped region 302, 420 consists of a moderately doped region 307, 422 with concentration between $1 \times 10^{14}$ cm$^{-3}$ and $1 \times 10^{18}$ cm$^{-3}$, and a highly doped region 305, 424 at the interface with a concentration above $1 \times 10^{18}$ cm$^{-3}$. The purpose of the highly doped region 305, 424 is the formation of an ohmic contact with a metal electrode. The highly doped region 305, 424 is not depleted, while the moderately doped region 307, 422 may be partially depleted near its surrounding surface at the doping transition to the lowly doped region 306, 430.

The outer doped region 302, 420 is diffused downwards and reaches a maximum depth between 0.5 µm and 4 µm, for example 3 µm. Its shape and size are such that the remainder of the device can be depleted to a high degree, and such that the field peak 312 around the inner doped region 300 may be spherically uniform.

The combined doping profiles of the inner doped region 300, 410 and outer doped region 302, 420 near the top oxide interface 304 are such that the field peak 312 around the inner doped region 300, 410 does not extend entirely to the top oxide interface 304. Consequently, charges generated on this defective oxide interface have a lower probability of being multiplied. Additionally, charge trapping of carriers generated by an avalanche event is less likely. This condition may be satisfied by increasing the distance between the inner and outer doped regions near the interface, for example, by making the outer doped region bulge inwards on the interface Preferentially, the outer doped region 302, 420 encloses the inner doped region 300, 410 in a circular way. This encourages the formation of a spherically uniform field peak 312 around the inner doped region 302, 420.

Optionally, a shallow lowly doped region of the first type may be present at the top interface. It may have a depth smaller than 200 nm and the concentration between $1 \times 10^{12}$ cm$^{-3}$ and $1 \times 10^{15}$ cm$^{-3}$. The purpose of this region is to further reduce the field peak on the top interface. However, it also affects how the electric field builds up in the remainder of the device. The shallow lowly doped region is highly depleted at the operating condition.

The minimal spacing between the inner 300, 410 and outer 302, 420 doped regions may be between 2 µm and 10 µm, for example 5 µm. If the spacing is too large, full depletion of the lowly doped region 306, 430 at the breakdown voltage may be difficult in the horizontal direction. If the spacing is too small, horizontal depletion may occur at a (significantly) lower voltage than the breakdown voltage. Depending on the depth of the lowly doped region 306, 430, the latter may force a preferential field build-up and breakdown in the vertical or horizontal direction.

The lowly doped region 306, 430 may be of either the first or second doping type. It may have a doping concentration between $1 \times 10^{14}$ cm$^{-3}$ and 0 cm$^{-3}$, for example $1 \times 10^{12}$ cm$^{-3}$. The doping may be slightly graded in the downward direction. The nearly intrinsic doping enables easy depletion of the device and ensures that the electric field is not constrained by doping ions in the depleted volume.

The lowly doped region 306, 430 may have a depth between 5 µm and 30 µm, for example 10 µm. The depth may be between 1 and 4 times larger than the minimum spacing between the inner doped region 300, 410 and outer doped region 302, 420, for example 2 times larger. If the depth is too large, full depletion of the lowly doped region at the breakdown voltage may be difficult in the vertical direction. If the depth is too small, vertical depletion may occur at a (significantly) lower voltage than the breakdown voltage. Depending on the minimal spacing between the different doped regions and detector pitch, the latter may force a preferential field build-up and breakdown in the vertical or horizontal direction.

Optionally, the volume below the lowly doped region may be absent. If so, the device may be backside illuminated. If not, the volume may have a uniform doping concentration above $1 \times 10^{18}$ cm$^3$. The doping may gradually transition into the lowly doped region 306 over a distance below 5 µm.

Optionally, if the device is backside illuminated, a highly doped region may be present on the backside with a concentration above $1 \times 10^{18}$ cm$^{-3}$ and a thickness below 1 µm.

The pitch of SPADs in an array may be between 5 µm and 30 µm, for example 15 µm. If the pitch is too large, non-depleted regions may be present between SPADs and below the outer doped regions. Additionally, the large intermediate volume encourages thermal generation and noise. If the pitch is too small, the depletion regions of SPADs may overlap. This may influence the way the electric field builds up in the SPADs, for example, because each SPAD depletes faster in the horizontal direction compared to the vertical direction. Furthermore, a small pitch encourages optical crosstalk.

Figure 5:
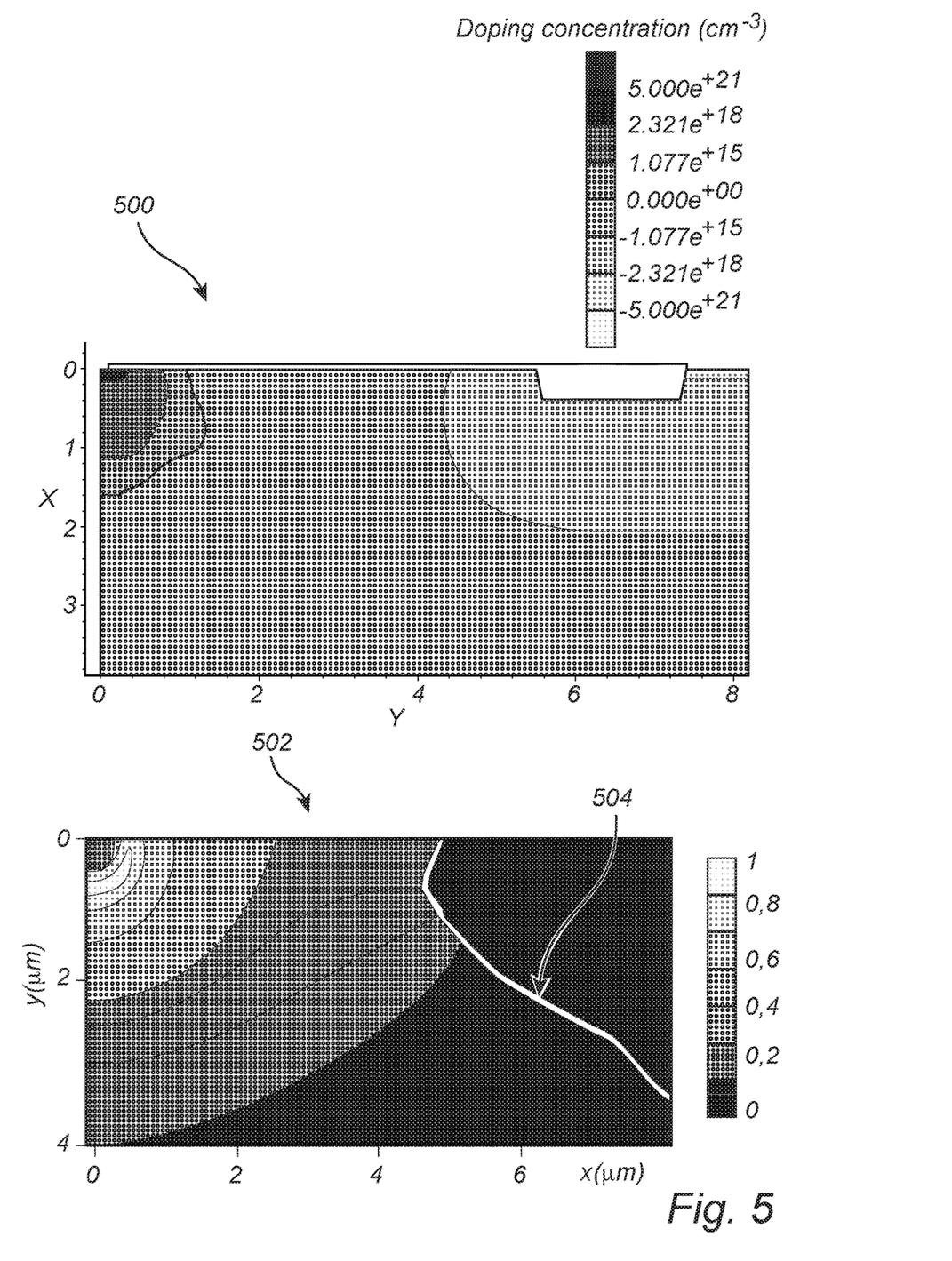
FIG. 5 shows a doping profile, normalized electric field and depletion region edge near a top interface of a SPAD with a geometry-constrained field. The rotationally symmetric axis is located at x=0 μm.

In conclusion, the electric field distribution is determined by all geometry and doping elements. Co-optimization of these elements is therefore required. As an example, FIG. 5 shows the doping profile 500 in a top graph of FIG. 5 and a normalized electric field 502 and depletion region 504 in a bottom graph of FIG. 5 near the top device interface in a relatively well-optimized design.

In the above, the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A single-photon avalanche diode (SPAD) for use in light detection with a complementary metal-oxide-semiconductor (CMOS) integrated circuit, the SPAD comprising:
   a semiconductor substrate comprising a top surface at a front side and a back side opposite the front side;
   an inner doped region disposed at a top surface of the semiconductor substrate connected to a first terminal, wherein a geometric structure of a boundary of the inner doped region is rotationally symmetric in a horizontal direction of the semiconductor substrate and wherein the inner doped region comprises dopant implantations of a first type;

at least one outer doped region disposed at the top surface of the semiconductor substrate connected to a second terminal, wherein the at least one outer doped region is arranged to at least partially enclose the inner doped region in the horizontal direction of the semiconductor substrate and wherein the outer doped region comprises dopant implantations of a second type; and a lowly doped depletion volume arranged to surround the inner doped region and comprising dopant implantations of the first type or dopant implantations of the second type, wherein a doping concentration of the lowly doped depletion volume is lower than that of the inner doped region or the at least one outer doped region, and wherein doping gradients at the boundary between the inner doped region and the lowly doped depletion volume is below $1\times10^{19}$ cm$^{-3}$ µm$^{-1}$, wherein a depth of the lowly doped depletion volume extending from the top surface of the semiconductor substrate into the semiconductor substrate is larger than a depth of the at least one outer doped region, wherein the second terminal and the back side of the semiconductor substrate are commonly connected, wherein one of the first terminal and the second terminal forms an anode and the other of the first terminal and the second terminal forms a cathode, and wherein when a reverse bias is applied to the anode, an electric field peak forms around the inner doped region to enable impact ionization and multiplication of charges.

2. The SPAD of claim 1, wherein the at least one outer doped region is arranged to at least partially enclose the inner doped region such that, when the reverse bias is applied to the anode, a surface of a space charge region at the at least one outer doped region is larger than a surface of a space charge region at the inner doped region.

3. The SPAD of claim 2, wherein a ratio of the depth of the lowly doped depletion volume to a horizontal spacing at the top surface between the inner doped region and the outer doped region is between 1-4.

4. The SPAD of claim 1, wherein the lowly doped depletion volume is configured to extend to a highly doped region at the back side.

5. The SPAD of claim 4, wherein the SPAD is configured for back side illumination, wherein the highly doped region is disposed at a surface of the back side, wherein a thickness of the highly doped region is less than 1 µm and a dopant concentration is greater than $1\times10^{18}$ cm$^{-3}$.

6. The SPAD of claim 4, wherein the SPAD is configured for front side illumination, the highly doped region has a dopant concentration above $1\times10^{18}$ cm$^{-3}$ and has a thickness less than 1 mm.

7. The SPAD of claim 1, wherein the inner doped region comprises an innermost region surrounded by an outermost region, wherein the innermost region has a higher doping concentration than the outermost region.

8. The SPAD of claim 1, wherein each of the at least one outer doped region comprises a highly doped region and a moderately doped region, the highly doped region having a higher doping concentration than the moderately doped region.

9. The SPAD of claim 8, wherein the highly doped region is configured to form an ohmic contact with the second terminal.

10. The SPAD of claim 9, wherein the moderately doped region is arranged closer to the inner doped region than the highly doped region and wherein the moderately doped region defines the depth of the at least one outer doped region.

11. The SPAD of claim 1, wherein the SPAD is configured such that, when the reverse bias is applied to the second terminal and the back side of the semiconductor substrate, the electric field peak does not extend to the top surface.

12. The SPAD of claim 11, further comprising a top layer of silicon dioxide arranged above the top surface of the semiconductor substrate, wherein connections between the inner doped region and the first terminal and between the at least one outer doped region and the second terminal extend through the top layer.

13. The SPAD of claim 1, wherein the at least one outer doped region is configured to completely enclose the inner doped region in the horizontal direction of the semiconductor substrate.

14. The SPAD of claim 13, wherein the at least one outer doped region is configured to circularly enclose the inner doped region.

15. The SPAD of claim 1, wherein the at least one outer doped region comprises a plurality of outer regions, wherein the plurality of outer regions together enclose the inner doped region forming an n-fold symmetry around the inner doped region, where n>3.

16. A sensor array, comprising:
an array of single-photon avalanche diodes (SPADs) wherein each SPAD in the array of SPADs is a SPAD according to of claim 1;
wherein the second terminals of each of the SPADs are commonly connected.

17. The sensor array according to claim 16, wherein the first terminals of each of the SPADs are separately connected for separate read-out of light detected by each of the SPADs.

18. The sensor array of claim 16, wherein the at least one outer doped regions of each of the SPADs are shared and form a single coherent region.

19. The sensor array of claim 16, wherein a deep trench isolation structure is provided between each pair of adjacent SPADs in the array of SPADs.

20. The sensor array of claim 16, wherein the lowly doped depletion volumes of adjacent SPADs transition into each other and the lowly doped depletion volume belonging to an individual SPAD is defined by a pitch of the array of SPADs.

* * * * *

UNITED STATES PATENT AND TRADEMARK OFFICE
CERTIFICATE OF CORRECTION

| | |
|---|---|
| PATENT NO. | : 11,335,825 B2 |
| APPLICATION NO. | : 17/030203 |
| DATED | : May 17, 2022 |
| INVENTOR(S) | : Edward Van Sieleghem |

It is certified that error appears in the above-identified patent and that said Letters Patent is hereby corrected as shown below:

In the Claims

Column 12, Line 39 (approx.), Claim 16, delete "to of" and insert -- to --.

Signed and Sealed this
Thirtieth Day of August, 2022

Katherine Kelly Vidal
*Director of the United States Patent and Trademark Office*